US006604815B2

United States Patent
Chen et al.

(10) Patent No.: US 6,604,815 B2
(45) Date of Patent: Aug. 12, 2003

(54) INK JET RECORDING APPARATUS UTILIZING PRINTHEAD CARTRIDGES WITH ASYMMETRICAL CONTACTS

(75) Inventors: Chih-Ching Chen, Taipei (TW); Tsung-Wei Huang, Taipei (TW)

(73) Assignee: BenQ Corporation, Tao-Yuan Hsien (TW)

( * ) Notice: Subject to any disclaimer, the term of this patent is extended or adjusted under 35 U.S.C. 154(b) by 0 days.

(21) Appl. No.: 10/065,106

(22) Filed: Sep. 18, 2002

(65) Prior Publication Data

US 2003/0035028 A1 Feb. 20, 2003

Related U.S. Application Data

(62) Division of application No. 09/682,300, filed on Aug. 16, 2001, now Pat. No. 6,533,396.

(51) Int. Cl.[7] .................. B41J 2/01; B41J 2/05
(52) U.S. Cl. .......................... 347/50; 347/58
(58) Field of Search ................. 347/50, 58, 87, 347/86; 439/67

(56) References Cited

U.S. PATENT DOCUMENTS

| | | | | |
|---|---|---|---|---|
| 4,872,026 A | * | 10/1989 | Rasmussen et al. | 347/56 |
| 4,907,018 A | * | 3/1990 | Pinkerpell et al. | 346/139 R |
| 5,422,667 A | * | 6/1995 | Daggs et al. | 347/87 |
| 5,610,642 A | * | 3/1997 | Nobel et al. | 347/50 |
| 5,793,396 A | * | 8/1998 | Sasaki | 347/86 |
| 5,984,464 A | * | 11/1999 | Steinfield et al. | 347/87 |
| 6,027,209 A | * | 2/2000 | Menendez et al. | 347/85 |
| 6,151,046 A | * | 11/2000 | Abe et al. | 347/50 |
| 6,161,915 A | * | 12/2000 | Bolash et al. | 347/19 |
| 6,168,262 B1 | * | 1/2001 | Clark et al. | 347/50 |
| 6,533,396 B2 | * | 3/2003 | Chen et al. | 347/50 |
| 2003/0035033 A1 | * | 2/2003 | Chen et al. | 347/86 |

FOREIGN PATENT DOCUMENTS

| | | | |
|---|---|---|---|
| EP | 610 965 | * | 12/1999 |
| WO | 96/05061 | * | 2/1996 |

* cited by examiner

Primary Examiner—Michael Nghiem
(74) Attorney, Agent, or Firm—Winston Hsu

(57) ABSTRACT

A printhead cartridge mounts within a carriage of a printer. The carriage moves along a first direction within the printer. The printhead cartridge includes an inkwell for storing ink, which has a front surface and a bottom surface, a printhead mounted on the bottom surface, and a plurality of contacts for receiving signals from the printer and to provide the signals to the printhead. A centerline of the front surface, running perpendicular to the first direction, evenly defines first and second sides of the front surface. The contacts are disposed on the front surface, and a distribution of the contacts on the first side exceeds a corresponding distribution of the contacts on the second side.

15 Claims, 9 Drawing Sheets

INK JET RECORDING APPARATUS UTILIZING PRINTHEAD CARTRIDGES WITH ASYMMETRICAL CONTACTS

CROSS REFERENCE TO RELATED APPLICATIONS

The following is a division of U.S. application Ser. No. 09/682,300, filed Aug. 16, 2001, now U.S. Pat. No. 6,533,396 which is included herein by reference.

BACKGROUND OF INVENTION

1. Field of the Invention

The present invention relates to an ink jet recording apparatus (IJRA). In particular, the present invention discloses an IRJA that utilizes printhead cartridges with asymmetrical contacts to enable a size reduction in a corresponding flexible circuit board (FCB) within the IRJA.

2. Description of the Prior Art

Please refer to FIG. 1. FIG. 1 is a perspective view of a prior art printhead cartridge 10. The prior art printhead cartridge 10 comprises an inkwell 12 and a tape automated bonding (TAB) structure 14. The TAB 14 is mounted on the inkwell 12, wrapping around from a front surface 15 to a bottom surface 19. The TAB 14 comprises a plurality of contacts 16, each with a corresponding trace 17 that electrically connects to a printhead 18. The printhead 18 is mounted on the TAB 14, and is disposed on the bottom surface 19 of the inkwell 12. The printhead cartridge 10 exhibits great symmetry along a cross-section A—A. If the printhead cartridge 10 were to be split down the middle along the line A—A, each half of the printhead cartridge 10 would have approximately the same number of contacts 16 (depending upon the parity of the number of contacts 16), and half of the printhead 18. The inkwell 12 is used to hold ink (not shown), and to provide this ink to the printhead 18. The printhead 18 performs a printing operation by jetting ink according to signals received from the contacts 16.

Please refer to FIG. 2 with reference to FIG. 1. FIG. 2 is a perspective view of a prior art printer 20. The printhead cartridge 10 is adapted for use in the printer 20. The printer 20 has a carriage 22 that holds two of the printhead cartridges 10, carrying the printhead cartridges 10 back and forth along a print track 24. The two printhead cartridges 10 are held as closely together as possible within the carriage 22. With each pass along the track 24, the printhead cartridges 10 form a print swath on a sheet of paper 21. Generally speaking, one of the printhead cartridges 10 performs a black-and-white printing operation, whereas the other printhead cartridge 10 performs a color printing operation using cyan, magenta and yellow inks. Together, the two printhead cartridges 10 are able to perform a full-color printing process upon the sheet of paper 21.

Please refer to FIG. 3 with reference to FIGS. 1 and 2. FIG. 3 is a schematic diagram of a flexible circuit board (FCB) 30 within the printer 20. The FCB 30 is disposed within the carriage 22 and is used to establish electrical communications with the printhead cartridges 10. The FCB 30 has a plurality of dimples 36, each of which establishes an electrical connection with one of the corresponding contacts 16 of the printhead cartridges 10. In this manner, the printer 20 is able to control the printhead 18 of each printhead cartridge 10.

The cost associated with the FCB 30 is related to the overall surface area of the FCB 30. By reducing the size of the FCB 30, it should be possible to reduce the total cost of the printer 10.

SUMMARY OF INVENTION

It is therefore a primary objective of this invention to provide an ink jet recording apparatus (IRJA) that utilizes printhead cartridges having an asymmetric distribution of contacts to reduce a size of a corresponding contact surface within the IRJA.

Briefly summarized, the preferred embodiment of the present invention discloses a printhead cartridge that mounts within a carriage of a printer. The carriage moves along a first direction within the printer. The printhead cartridge includes an inkwell for storing ink, which has a front surface and a bottom surface, a printhead mounted on the bottom surface, and a plurality of contacts for receiving signals from the printer and to provide the signals to the printhead. A centerline of the front surface, running perpendicular to the first direction, evenly defines first and second sides of the front surface. The contacts are disposed on the front surface, and a distribution of the contacts on the first side exceeds a corresponding distribution of the contacts on the second side.

It is an advantage of the present invention that by providing an asymmetric distribution of the contacts of the front surface of a printhead cartridge, two such mirrored cartridges will form a combined density of contacts that is higher towards their combined center position. The traces on a contact surface within the carriage of the printer can be made to run between two columns of dimples. The size of the corresponding contact surface can be reduced as a result of this, which leads to a total lower cost of the printer.

These and other objectives of the present invention will no doubt become obvious to those of ordinary skill in the art after reading the following detailed description of the preferred embodiment, which is illustrated in the various figures and drawings.

DETAILED DESCRIPTION

Figure 1:
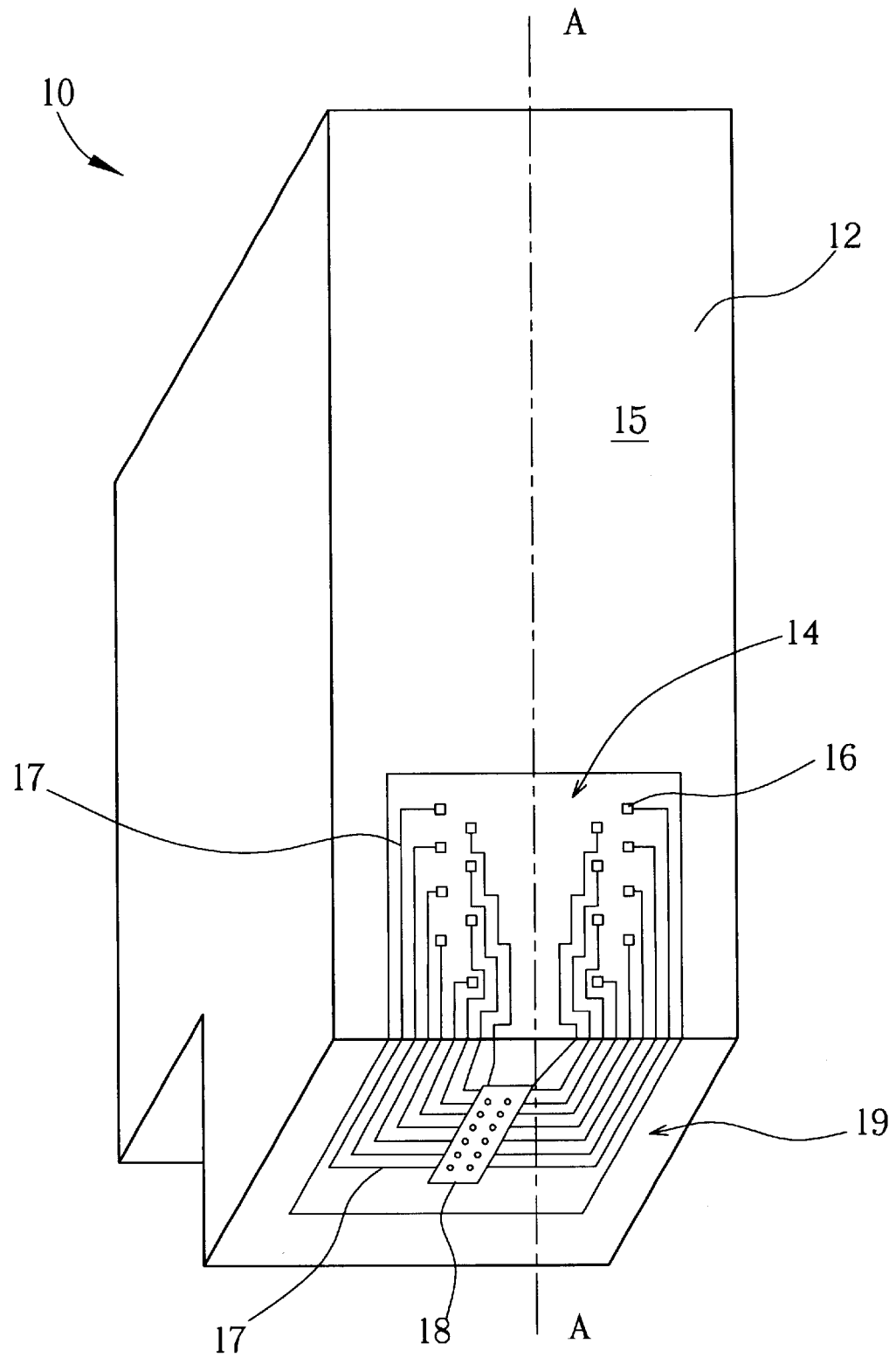
FIG. 1 is a perspective view of a prior art printhead cartridge.
Figure 2:
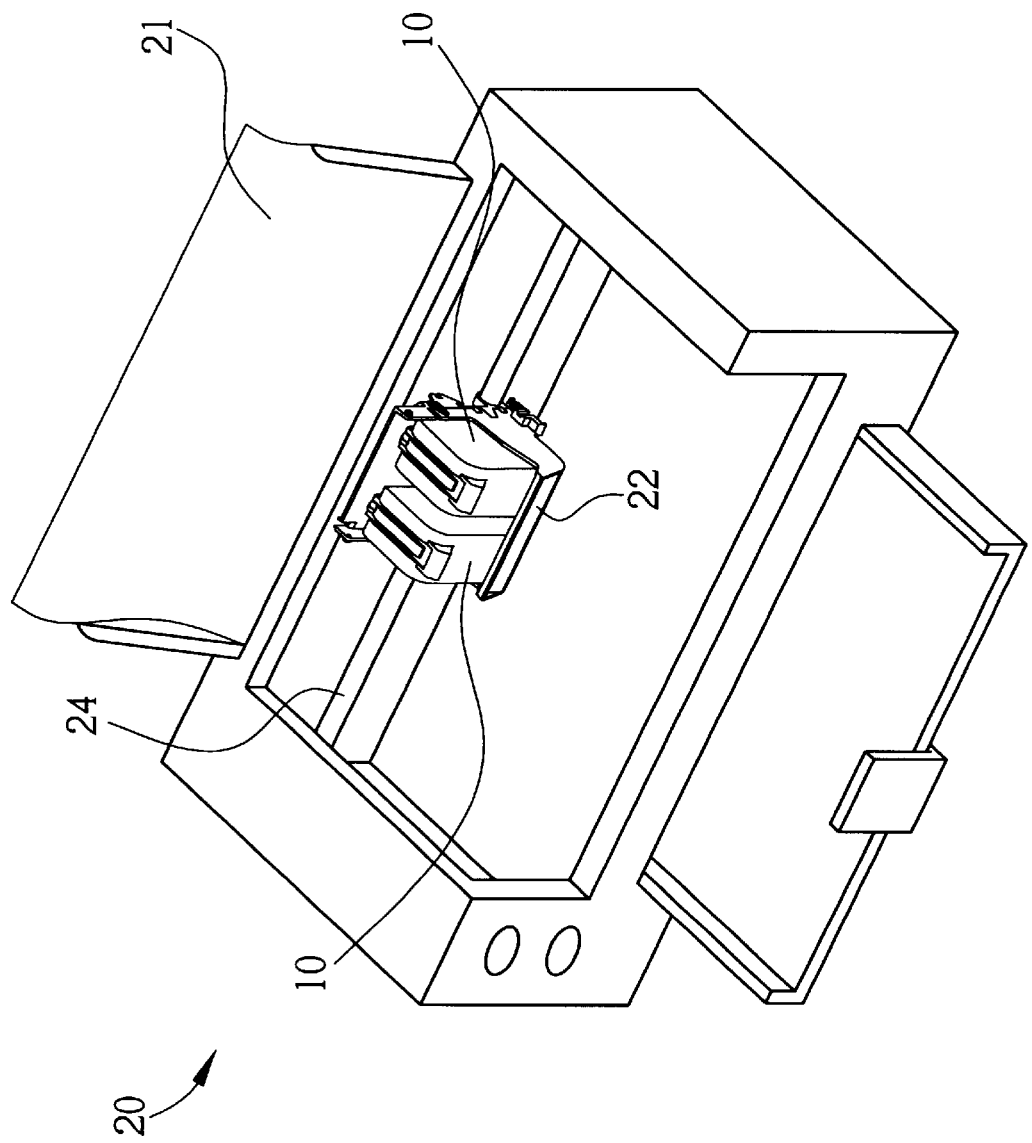
FIG. 2 is a perspective view of a prior art printer.
Figure 3:
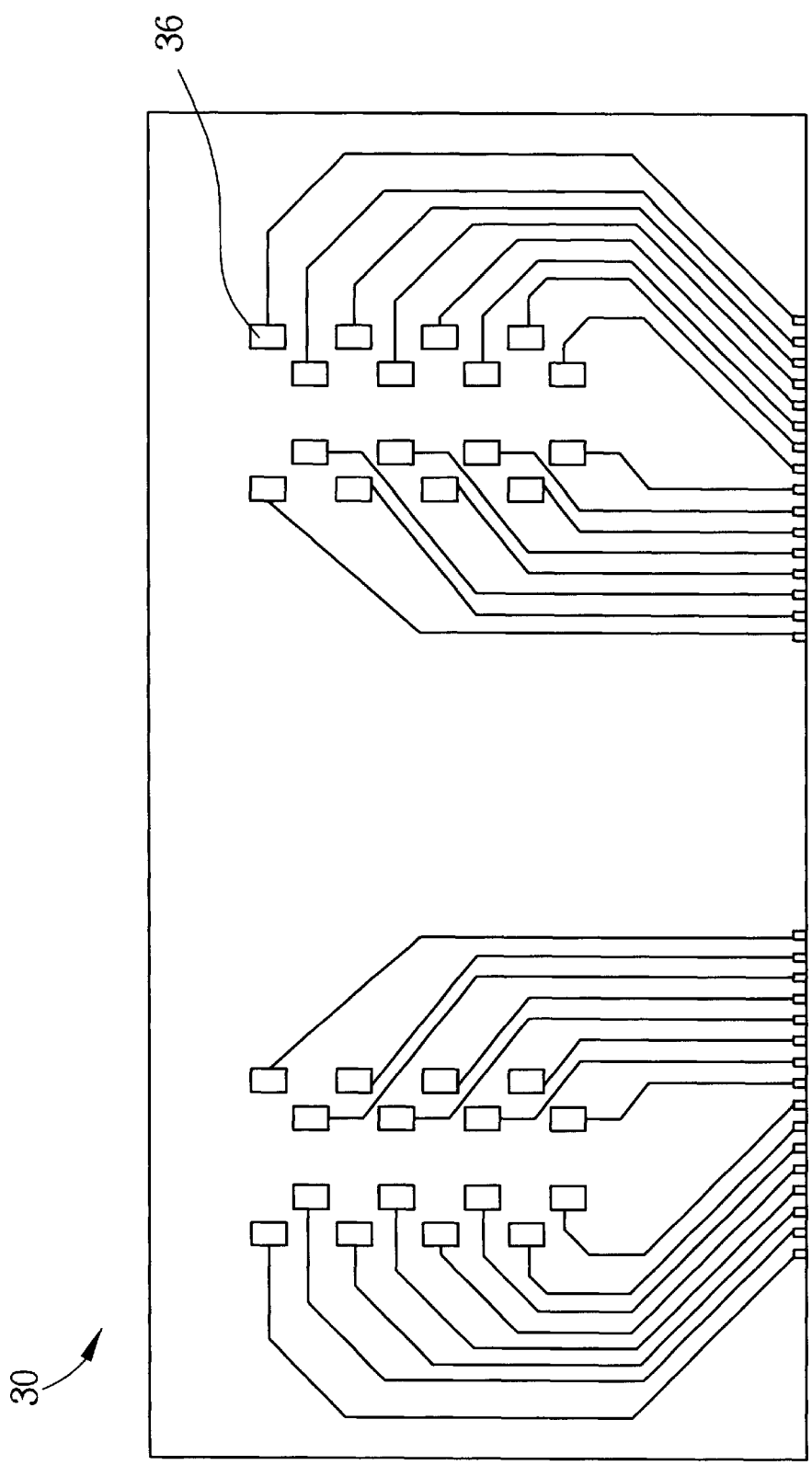
FIG. 3 is a schematic diagram of a flexible circuit board (FCB) within the printer of FIG. 2.
Figure 4:
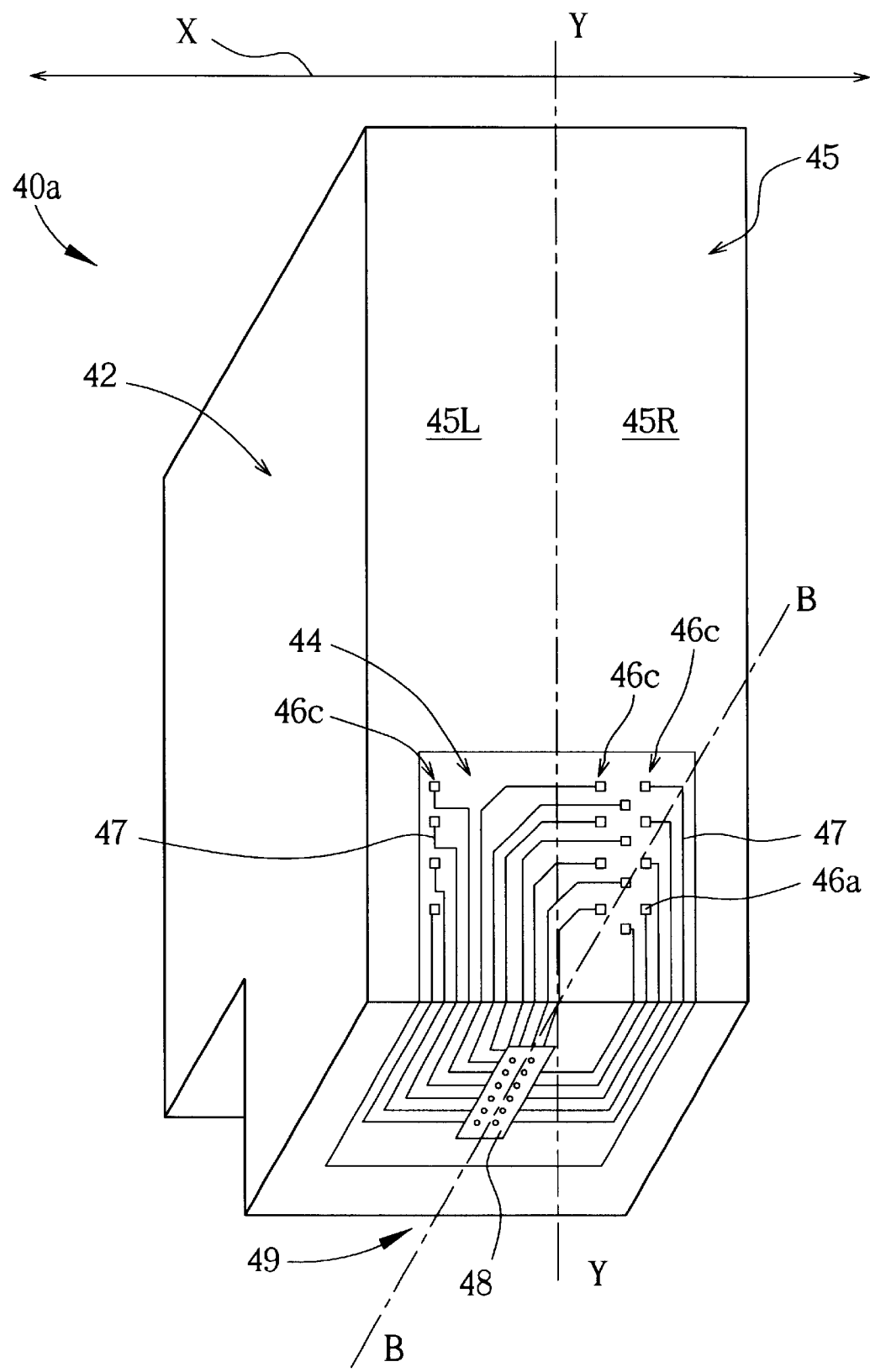
FIG. 4 is a perspective view of a preferred embodiment of a printhead cartridge according to the present invention.

Please refer to FIG. 4. FIG. 4 is a perspective view of a preferred embodiment printhead cartridge 40a according to the present invention. The printhead cartridge 40a comprises an inkwell 42, and a tape automated bonding (TAB) structure 44 mounted on the inkwell 42. The inkwell 42 has a front surface 45 and a bottom surface 49. The TAB 44 is mounted on the front surface 45, and wraps around to the bottom surface 49. The TAB 44 includes a plurality of contacts 46a, each in electrical connection with a printhead 48 by way of a trace 47. All of the contacts 46a are on the front surface 45 of the inkwell 42, whereas the printhead 48 is disposed on the bottom surface 49. The contacts 46a are arranged in a plurality of columns 46c. The inkwell 42 provides ink (not shown) to the printhead 48. The printhead 48 jets the ink according to signals received from the contacts 46a.

Figure 5:
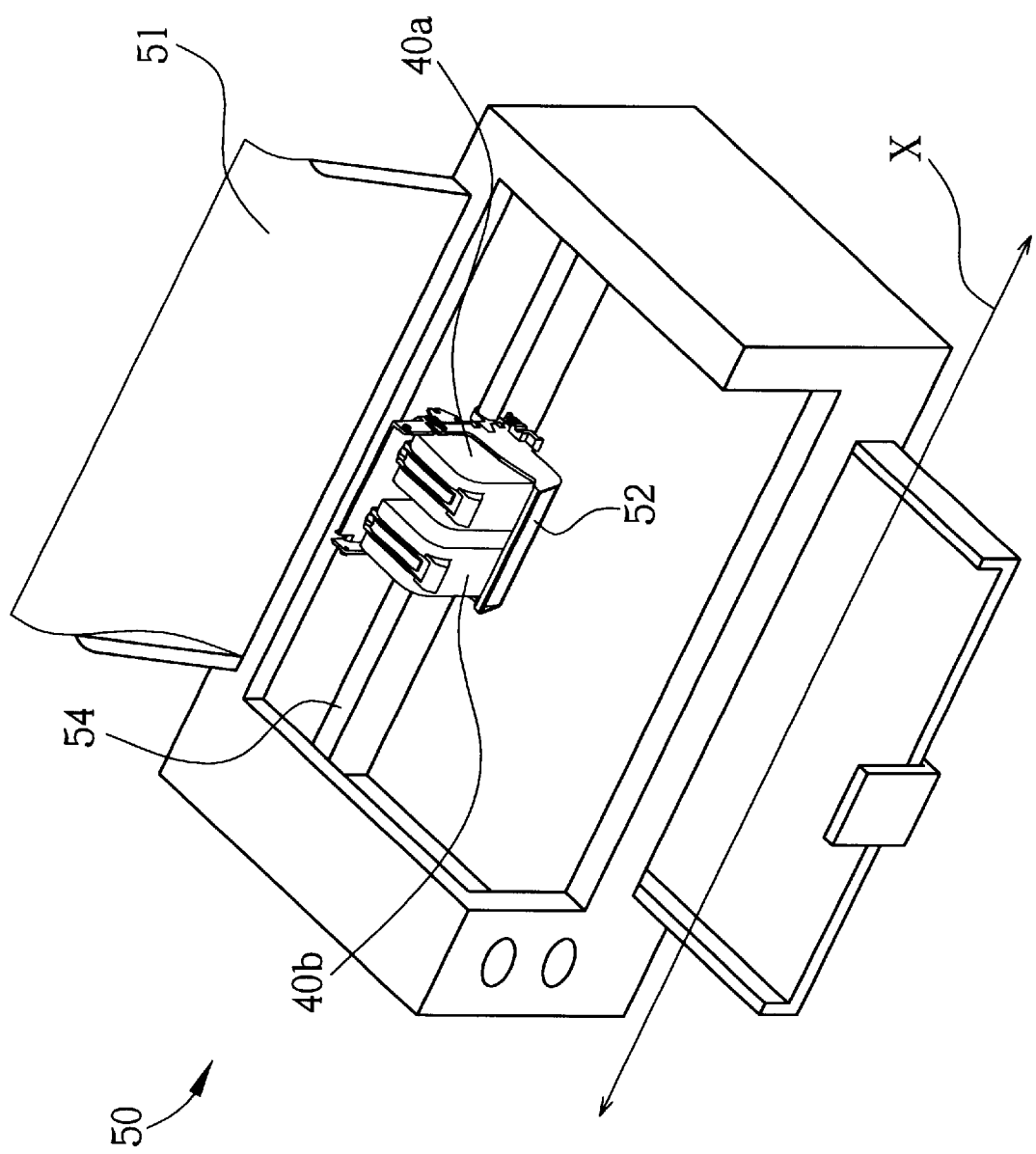
FIG. 5 is a perspective view of a printer according to the present invention.

Please refer to FIG. 5 with reference to FIG. 4. FIG. 5 is a perspective view of a printer 50 according to the present invention. The printhead cartridge 40a is adapted for use within the printer 50. The printer 50 includes a carriage 52 that holds the printhead cartridge 40a, and carries the printhead cartridge 40a back and forth along a direction X of a print track 54. With each pass along the print track 54, the printhead cartridge 40a jets ink onto a document 51 to perform a printing operation. The printhead cartridge 40a is mounted in an upright manner within the carriage 52, the bottom surface 49 facing downwards, so that gravity may help to feed ink to the printhead 48. The printhead cartridge 40a has a centerline along a direction Y—Y, which evenly defines a first side 45R and a second side 45L of the front surface 45. This centerline Y—Y, a vertical bisector, is perpendicular to the direction X of the print track 54. The first side 45R has about half of the total surface area of the front surface 45, with the second side 45L having the remainder. A majority of the contacts 46a are disposed on the first side 45R, so that the distribution of contacts 46a on the first side 45R exceeds that of the second side 45L. That is, the number of contact columns 46c on the first side 45R is different from the number of contact columns 46c on the second side 45L. The distribution of contacts 46a is thus asymmetric with respect to the centerline Y—Y. This asymmetric distribution is in excess of any simple disparities brought about by parity (i.e., an odd number of contacts 46a). The first side 45R should have at least 5 percent more contacts 46a than the second side 45L. The bottom surface 49 also has a centerline B—B, which substantially evenly divides the bottom surface 49. Note that the centerline B—B aligns with the centerline Y—Y, so that if one were to evenly split the printhead cartridge 40a in half, one would have to cut along both the centerline Y—Y and the centerline B—B. The printhead 48 lies evenly disposed along the centerline B—B.

Figure 6:
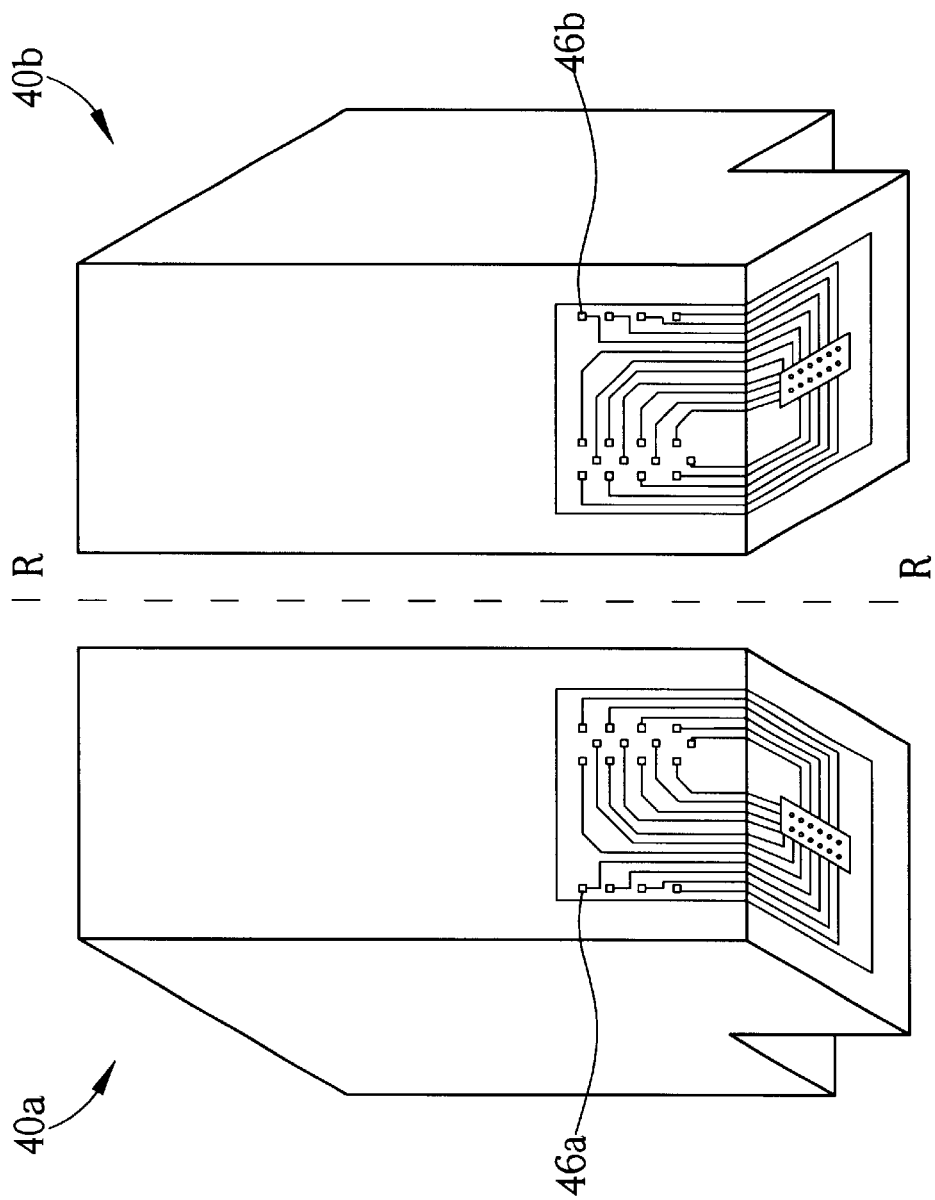
FIG. 6 is a perspective view of printhead cartridges according to the present invention, which are to be used in the printer of FIG. 5.

The printhead cartridge 40a is preferably designed to work in conjunction with a complementary printhead cartridge 40b. For example, the printhead cartridge 40a may hold only colored ink, whereas the printhead cartridge 40b will hold black ink. Please refer to FIG. 6 with reference to FIGS. 4 and 5. FIG. 6 is a perspective view of the printhead cartridges 40a and 40b according to the present invention, which are to be used in the printer 50. The printhead cartridge 40b also has an asymmetrical distribution of contacts 46b in accordance with the present invention, with a higher distribution of contacts 46b being towards the printhead cartridge 40a. The printhead cartridge 40b may be thought of as a reflection along a line R—R of the printhead cartridge 40a, as regards the distribution of the contacts 46b with respect to that of the contacts 46a. Of course, the printhead cartridge 40b may have a fewer or greater number of contacts 46b than contacts 46a. The key point is, however, that a greater number of contacts 46a and 46b are moved closer towards the imaginary line R—R between the printhead cartridges 40a and 40b. By placing a greater percentage of the contacts 46a and 46b closer together, a size reduction can be made on a corresponding flexible circuit board (FCB) within the carriage 52.

Figure 7:
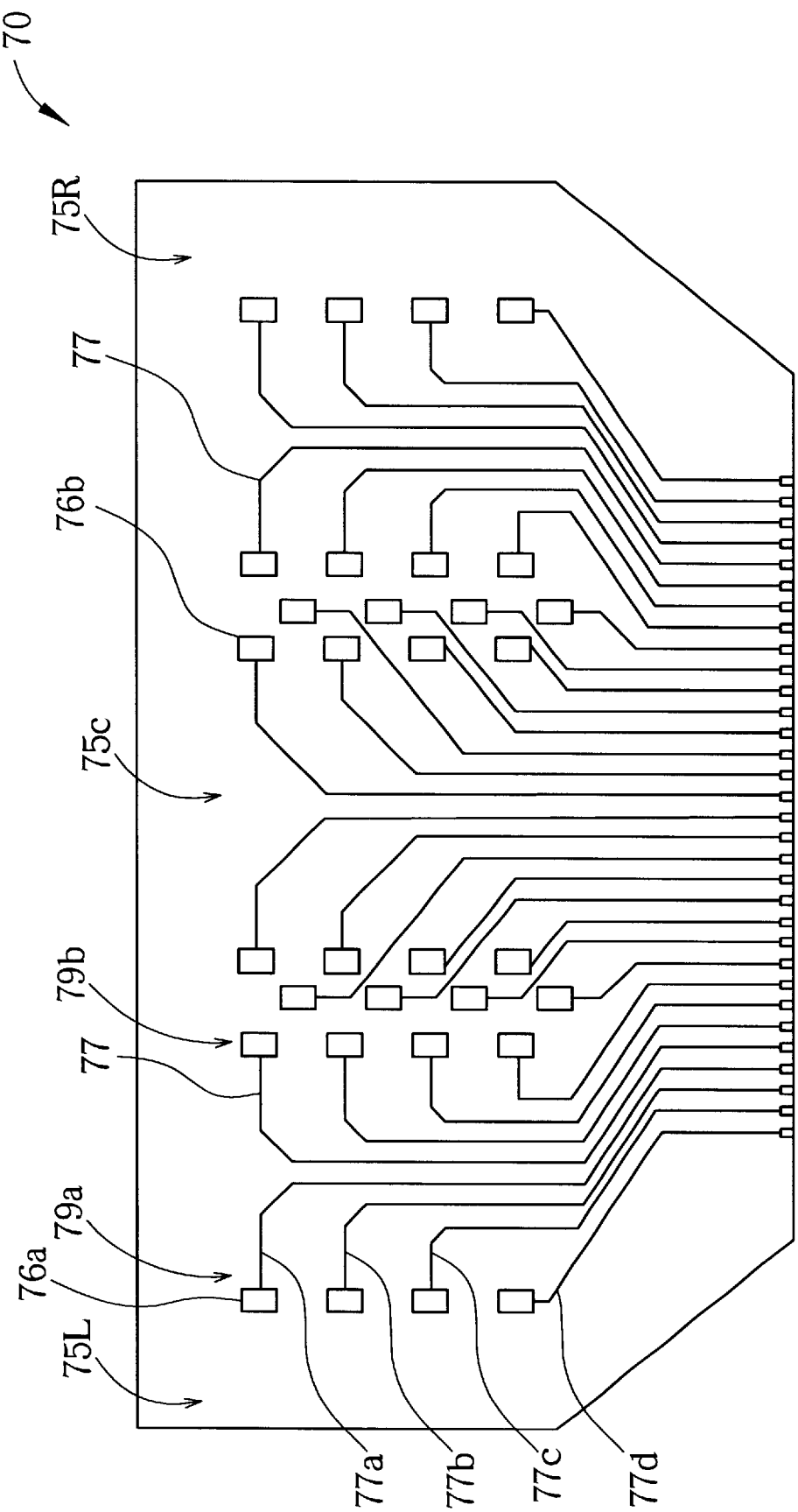
FIG. 7 is a schematic diagram of a flexible circuit board (FCB) disposed within a carriage of the printer of FIG. 5.

Please refer to FIG. 7 with reference to FIGS. 4, 5 and 6. FIG. 7 is a schematic diagram of a flexible circuit board (FCB) 70 disposed within the carriage 52 of the printer 50. The FCB 70 is used as a contact surface to establish electrical connections with each contact 46a and 46b of the printhead cartridges 40a and 40b, respectively. The FCB 70 has a plurality of dimples 76a, each of which establishes an electrical connection with one corresponding contact 46a, and a plurality of dimples 76b, each of which establishes an electrical connection with one corresponding contact 46b. In this manner, by way of the FCB 70, the printer 50 is capable of sending signals to the printhead cartridges 40a and 40b. The complementary asymmetric distributions of the contacts 46a and 46b on their respective printhead cartridges 40a and 40b leads to a greater concentration of corresponding dimples 76a and 76b towards a center 75c of the FCB 70, the center 75c being bounded by the centerlines of the paired printhead cartridges 40a and 40b. This, in turn, leads to a corresponding decrease in the number of dimples 76a and 76b on the sides 75L and 75R of the FCB 70, which lie outside the bounds of the center 75c. A consequence of this is that traces 77 from the dimples 76a and 76b are more concentrated in the center 75c of the FCB 70, and fewer traces 77 need be made that run along the sides 75L and 75R of the FCB 70. The traces 77 may also be made to run between two columns of dimples, such as between columns 79a and 79b. The sides 75R and 75L may thus be pulled in towards the center 75c, which leads to a size reduction of the FCB 70. As an extreme example of this, if all of the contacts 46a of the printhead cartridge 40a were placed upon the side 45R, the traces 77a, 77b, 77c and 77d would clearly move closer towards the center 75c of the FCB 70. The region thus currently occupied by the traces 77a–77d could thus be trimmed away from the FCB 70, leading to a further reduction in size of the FCB 70.

Figure 8:
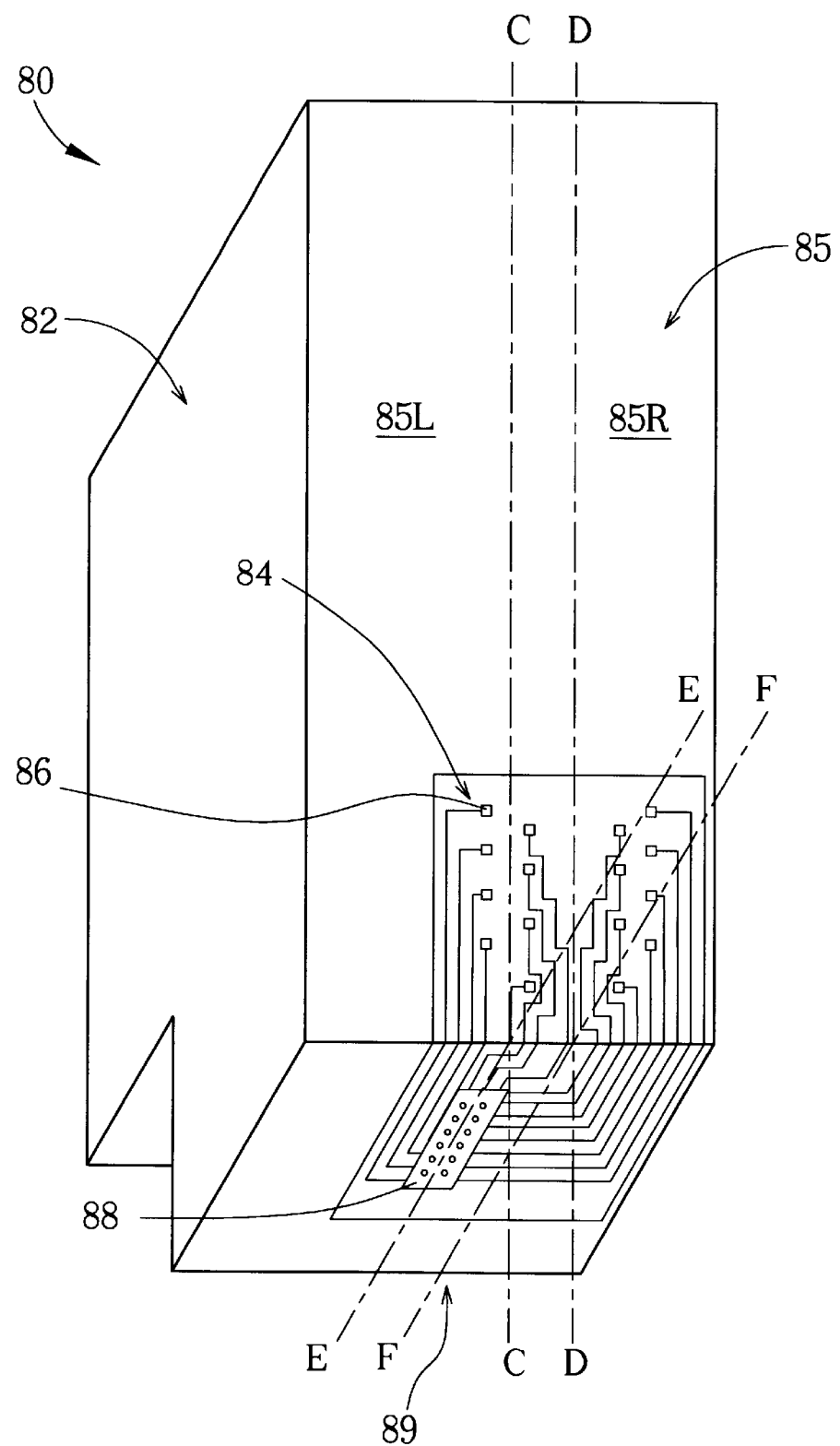
FIG. 8 is a perspective view of a second embodiment printhead cartridge according to the present invention.

Several methods may be utilized to create an asymmetric distribution of contacts on a printhead cartridge so as to enjoy the corresponding result in a size reduction of the contact surface (i.e., the FCB 70) within the printer. The preferred embodiment is depicted in FIG. 4, in which the centerline B—B of the TAB 44 aligns with the centerline Y—Y of the front surface 45. In this case, more contacts 46a are concentrated on one side of the centerline Y—Y than on the other, leading to the asymmetric distribution of contacts 46a. Alternatively, however, the TAB 44 itself may be moved to be asymmetric with respect to the centerline Y—Y. Please refer to FIG. 8. FIG. 8 is a second embodiment 80 of a printhead cartridge according to the present invention. The printhead cartridge 80 includes an inkwell 82 and a TAB 84. The inkwell 82 has a front surface 85 and a bottom surface 89. The front surface 85 is evenly defined by a centerline C—C into a first side 85R and a second side 85L. The bottom surface 89 is similarly evenly divided by a centerline E—E, which aligns with the centerline C—C. The TAB 84 is disposed on both the front surface 85 and bottom surface 89 of the inkwell 82, having a plurality of contacts 86 disposed on the front surface 85, and a printhead 88 on the bottom surface 89. The portion of the TAB 84 mounted on the front surface 85 is evenly divided by a centerline D—D, whereas the portion of the TAB 84 mounted on the bottom surface 89 is evenly divided by a centerline F—F. The centerline D—D aligns with the centerline F—F to evenly divide the entire TAB 84. The contacts 86 are symmetrically disposed around the TAB 84 centerline D—D so that, excepting parity considerations, an equal number of contacts 86 are on one side of the centerline D—D as on the other side of the centerline D—D. However, the centerline D—D of the TAB 84 is offset from the centerline C—C of the front surface 85. This causes more contacts 86 to be disposed within the side 85R, which leads to an asymmetric distribution of the contacts 86 on the front surface 85 with respect to the centerline C—C. On the bottom surface 89, the printhead 88 is mounted in alignment with the centerline E—E of the bottom surface 89, rather than the centerline F—F of the TAB 84. In this manner, the printhead 88 remains centrally aligned on the bottom surface 89, which is preferred as only one type of inkwell 82 must thus be fashioned.

Figure 9:
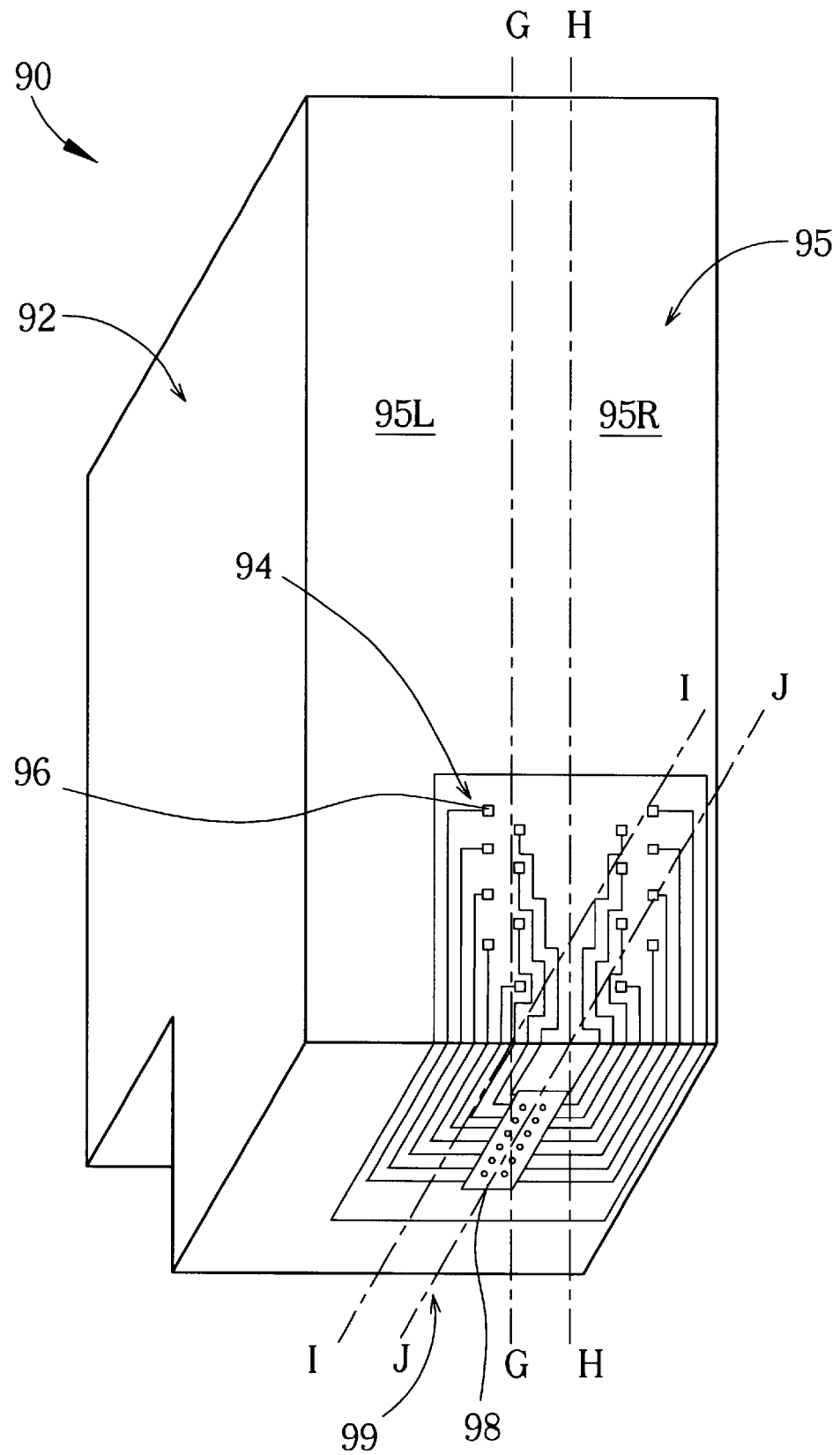
FIG. 9 is a perspective view of a third embodiment printhead cartridge according to the present invention.

A printhead centrally aligned on the bottom surface of the inkwell is not a prerequisite, however, of the present invention. Please refer to FIG. 9. FIG. 9 is a third embodiment 90 of a present invention printhead cartridge. In this embodiment, as in the previous embodiment 80, centerlines H—H and J—J of the TAB 94 are offset from the corresponding centerlines G—G and I—I of the inkwell 92. However, the printhead 98 is aligned with the TAB 94 centerline J—J of the bottom surface 99. Consequently, both the contacts 96 and the printhead 98 are symmetric with respect to the TAB 94, but are asymmetric with respect to the inkwell 92. This design is considered somewhat inferior, though, as it requires two different types of inkwell 92: one that supports a greater distribution of contacts 96 on the side 95R, and another that supports a greater distribution of contacts 96 on the side 95L.

In contrast to the prior art, the present invention provides a printer that utilizes an asymmetric distribution of contacts on the front surface of an ink jet cartridge inkwell. By pairing two such printhead cartridges together, each with opposing symmetries of contacts, a greater number of contacts may be brought closer together in the pairing of the printhead cartridges. For a contact surface within the printer that is used to establish communications with the paired printhead cartridges (i.e., an FCB), a higher density of corresponding dimples are brought towards the center of this connecting surface. The outer edges of the surface may thus be trimmed away, leading to a size reduction of the surface, and consequently, reduced costs associated with the printer.

Those skilled in the art will readily observe that numerous modifications and alterations of the device may be made while retaining the teachings of the invention. For example, it may be possible to trim at least one corner of the TAB, or make the TAB into a wavy shape. Accordingly, the above disclosure should be construed as limited only by the metes and bounds of the appended claims.

What is claimed is:

1. An ink jet recording apparatus (IJRA) comprising:
    a carriage for carrying a pair of printhead cartridges, at least one of which printhead cartridges has an asymmetric distribution of contacts, each printhead cartridge having a front surface with a respective centerline that divides the front surface into two sides having approximately equal areas; and
    a flexible circuit board (FCB) disposed within the carriage and used to establish electrical coupling with the paired printhead cartridges, the FCB comprising:
        a contact surface having a central region bounded by the centerlines of the paired printhead cartridges, and a peripheral region that is outside of the central region;
        a plurality of conductive traces disposed on the contact surface; and
        a plurality of dimples disposed on the contact surface and electrically coupled with the conductive traces to couple with the paired printhead cartridges,
        wherein due to the asymmetric distribution of contacts on the at least one printhead cartridge, the number of dimples in the central region exceeds the number of dimples in the peripheral region.

2. The ink jet recording apparatus of claim 1 wherein the number of dimples in the central region of the contact surface is at least 5 percent greater than the number of dimples in a peripheral region of the contact surface.

3. The ink jet recording apparatus of claim 1 wherein the dimples disposed on the contact surface are arranged in a plurality of columns.

4. The ink jet recording apparatus of claim 3 wherein the number of columns in the central region of the contact surface is greater than the number of columns in a peripheral region of the contact surface.

5. The ink jet recording apparatus of claim 4 wherein the conductive traces run between the columns of dimples.

6. The ink jet recording apparatus of claim 3 wherein the conductive traces run between the columns of dimples.

7. The ink jet recording apparatus of claim 1 wherein the paired printhead cartridges have opposing contact symmetries so that a greater number of contacts may be brought closer together.

8. The inkjet recording apparatus of claim 1 wherein the central region of the contact surface is bisected by an imaginary line between the paired printhead cartridges.

9. A flexible circuit board (FCB) disposed within a carriage of an ink jet recording apparatus (IJRA), the FCB used to establish electrical coupling with paired printhead cartridges, at least one of which printhead cartridges has an asymmetric distribution of contacts, each printhead cartridge having a front surface with a respective centerline that divides the front surface into two sides having approximately equal areas, the FCB comprising:
    a contact surface having a central region bounded by the centerlines of the paired printhead cartridges, and a peripheral region that is outside of the central region;
    a plurality of conductive traces disposed on the contact surface; and
    a plurality of dimples disposed on the contact surface and electrically coupled with the conductive traces to couple with the paired printhead cartridges,
    wherein due to the asymmetric distribution of contacts on the at least one printhead cartridge, the number of dimples in the central region exceeds the number of dimples in the peripheral region.

10. The flexible circuit board of claim 9 wherein the number of dimples in the central region of the contact surface is at least 5 percent greater than the number of dimples in a peripheral region of the contact surface.

11. The flexible circuit board of claim 9 wherein the dimples disposed on the contact surface are arranged in a plurality of columns.

12. The flexible circuit board of claim 11 wherein the number of columns in the central region of the contact surface is greater than the number of columns in a peripheral region of the contact surface.

13. The flexible circuit board of claim 12 wherein the conductive traces run between the columns of dimples.

14. The flexible circuit board of claim 12 wherein the central region of the contact surface is bisected by an imaginary line between the paired printhead cartridges.

15. The flexible circuit board of claim 11 wherein the conductive traces run between the columns of dimples.

* * * * *